United States Patent [19]

Jang

[11] Patent Number: 5,439,839
[45] Date of Patent: Aug. 8, 1995

[54] SELF-ALIGNED SOURCE/DRAIN MOS PROCESS

[75] Inventor: Wen-Yueh Jang, Hsin Chu, Taiwan

[73] Assignee: Winbond Electronics Corporation, Hsin Chu, Taiwan

[21] Appl. No.: 274,537

[22] Filed: Jul. 13, 1994

[51] Int. Cl.⁶ ............... H01L 21/266; H01L 21/8234
[52] U.S. Cl. .................... 437/44; 437/909; 437/984; 257/336; 257/344
[58] Field of Search ............ 437/27, 44, 41, 909, 437/984; 257/336, 344

[56] References Cited

U.S. PATENT DOCUMENTS 5,328,862  7/1994  Goo .............................. 437/41
5,358,879  10/1994  Brady et al. .................... 437/44

FOREIGN PATENT DOCUMENTS 3-74848  3/1991  Japan ............................ 437/44
5-129325  5/1993  Japan ............................ 257/344
5-267331  10/1993  Japan ............................ 437/44

OTHER PUBLICATIONS

Hori et al., "A Self-Aligned Pocket Implantation (SPI) Technology for 0.2 micron Dual-Gate CMOS", IEEE Electron Device Letters, vol. 13, No. 4, Apr. 1992, pp. 174–176.

"Simplified Lightly Doped Drain Process", IBM Technical Disclosure Bulletin, vol. 30, No. 12, May 1988, pp. 180–181.

Primary Examiner—Olik Chaudhuri
Assistant Examiner—Richard A. Booth
Attorney, Agent, or Firm—Meltzer, Lippe, Goldstein et al.

[57] ABSTRACT

A self-aligned contact process for making an MOS device results in an MOS device with a small and repeatable interconnect size, repeatable interconnect resistance, and reduced source/drain junction capacitance.

3 Claims, 5 Drawing Sheets

SELF-ALIGNED SOURCE/DRAIN MOS PROCESS

FIELD OF THE INVENTION

The present invention relates to a method for forming an MOS device with self-aligned source and drain contact processes.

BACKGROUND OF THE INVENTION

FIG. 1 schematically illustrates a conventional MOSFET device 10, in particular an N-MOS device. The device comprises a P-well 12 which is formed in an N-type silicon substrate (not shown). The source and drain regions 14 and 16 are N+ type and are formed at the surface of the P-well 12. A gate structure is formed over the channel 18 between the source and drain regions. More specifically, gate 20 is formed from a conducting material such as polysilicon. The gate 20 is separated from the surface of the P-well by the gate oxide ($SiO_2$) 22. Oxide spacers 24 and 26 are located on either side of the gate 20. The lightly doped regions 34 and 36 are provided to reduce the device hot carrier effects. The field oxide regions 38 are provided to separate adjacent MOS devices in an integrated circuit. A Metal-Poly-Dielectric (MPD) layer 42 is deposited over the surface of the device 10. Openings are formed in the MPD layer 42 so that metal contacts 44 and 46 can be made to the source and drain regions 14 and 16.

In the conventional device 10, the source and drain areas are large in order to allow for contact-to-gate and contact-to-FOX edge misalignment. The capacitance between the source and the P-well and the drain and the P-well is quite large. These capacitances are referred to or the "source/drain to substrate" capacitances. The large source/drain to substrate capacitances can degrade circuit performance seriously.

To overcome this problem, a self-aligned contact process has been developed. A MOSFET (an N-MOS device) which has been formed using the self-aligned contact process is illustrated in FIG. 2.

The N-MOS device 10' of FIG. 2 differs from the device 10 of FIG. 1 as follows. The gate 20 is enclosed by a dielectric 21 which may be oxide ($SiO_2$) or nitride ($Si_3N_4$). Moreover, the metal contacts 44 and 46 do not directly contact the source and drain regions 14 and 16 (as shown in FIG. 1). Instead, In FIG. 2, the interconnects 54 and 56 directly contact the source and drain 14 and 16. The interconnects 54 and 56 may be formed in part directly over the FOX regions 38 or over the gate enclosing dielectric 21. The metal contacts 44 and 46 then contact the interconnects 54 and 56. For this reason, the source and drain regions 14 and 16 may be smaller in the device 10' of FIG. 2 than in the device 10 of FIG. 1.

However, the device 10' of FIG. 2 still has a certain deficiency. The area of the source and drain 14 and 16 (or more particularly, the area at which the interconnects 54 and 56 contact the source and drain 14 and 16) must still be large enough to account for the worst case misalignment between the gate and field oxide (FOX) region that is still acceptable for proper source and drain connection. Thus, even in the device 10' of FIG. 2, the source and drain regions 14 and 16 still have a substantial size.

It is an object of the present invention to provide a self-aligned contact process for making a MOS device which overcomes the deficiencies of the prior art MOS devices. More particularly, it is an object of the invention to provide a self-aligned contact process for making a MOS device in which the source and drain regions are smaller than devices made using a conventional self-aligned process.

SUMMARY OF THE INVENTION

A method for forming a MOS device in accordance with an illustrative embodiment of the invention comprises the following steps (1) forming a thin gate oxide and thicker field oxide regions on the surface of a substrate (e.g. on the surface of a P-well formed in an N-type silicon substrate), (2) forming a polysilicon (or polycide) layer over the gate oxide, (3) forming an oxide layer on the polysilicon layer, (4) patterning the polysilicon layer and oxide layer to form the gate (which is polysilicon) and a protective oxide layer on top of the gate, (5) implanting lightly doped source and drain (LDD) regions on either side of the gate, the lightly doped source and drain regions having an opposite conductivity type to that of the substrate (e.g. lightly doped source and drain regions are N-type when formed in a P-well), (6) forming a dielectric such as oxide which encloses the gate and which covers the lightly doped source and drain regions, then anisatropically etching the oxide to form the oxide spacer, (7) forming spacers (e.g. nitride spacers) on either side of the enclosing dielectric, which spacers cover a portion of the lightly doped source and drain regions, (8) forming an oxide layer (S/D oxide layer) on the portion of the source and drain regions not covered by the enclosing dielectric or spacers, (9) removing the nitride spacers,

(10) implanting through the openings left by the removed nitride spacers heavily doped source and drain regions in a portion of the volume occupied by the lightly doped source and drain regions. (The net result is that the source and drain each comprise a heavily doped region with a lightly doped region on either side).

(11) forming source and drain interconnects in contact with the heavily doped source and drain regions in the opening left by the removed nitride spacers and over the FOX regions and/or enclosing dielectric.

(12) forming metallic contacts to the source and drain interconnects.

This process has the following significant advantages:

(1) The size of the heavily doped source and drain regions and the size (i.e. area) of the source and drain interconnects are determined by the size of the nitride spacers. Thus, the small size of the heavily doped source and drain regions and corresponding small size of the source and drain interconnects is easily reproducible in production. The resistance of the self-aligned source and drain interconnects is also well controlled and reproducible in production.

(2) Although the source/drain junction area may be the same as in the case of the conventional self-aligned contact MOS device (see FIG. 2), because the portion of the source and drain below the S/D oxide layer is lightly doped, the total source-drain capacitance is significantly reduced.

In short, the present invention results in a small and reproducible (i.e. repeatable) self-aligned interconnect size, with reproducible contact resistance and a smaller source/drain junction capacitance than the device formed using the conventional self-aligned contact process.

DETAILED DESCRIPTION OF THE INVENTION

The present invention is directed to a method for forming an MOS device using an improved self-aligned contact process. An illustrative embodiment of the invention is described below.

Figure 3:
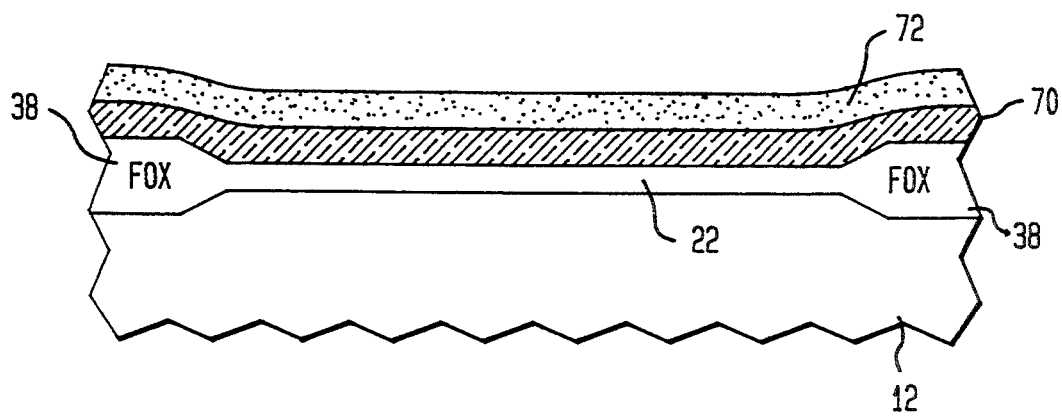
FIGS. 3,4,5,6,7,8,9,10,11 and 12 illustrate a self-aligned contact process for forming a MOS FET device according to an illustrative embodiment of the invention.

As shown in FIG. 3, a P-well 12 is formed in an N-type substrate (not shown). The dopant concentration in the P-well 12 is about $8 \times 10^{16}$ cm$^{-3}$. Then the field oxide (FOX) regions 38 are formed on the surface of the P-well. The FOX regions 38 have a thickness of about 5000 Å. A thin gate oxide layer 22 is then formed on the surface of the P-well between the FOX regions 38. The gate oxide layer 22 has a thickness of about 140 Å. Next, a polysilicon layer 70 is formed over the gate oxide 22 and field oxide 38. The polysilicon layer 70 has a thickness of 3000 Å and is doped using phosphorus atoms with a concentration of $10^{20}$ cm$^{-3}$. The layer 70 may be polycide instead of polysilicon. Then an oxide layer 72 is formed on top of the polysilicon layer 20. The oxide layer 72 has a thickness of 2000 Å.

Figure 4:
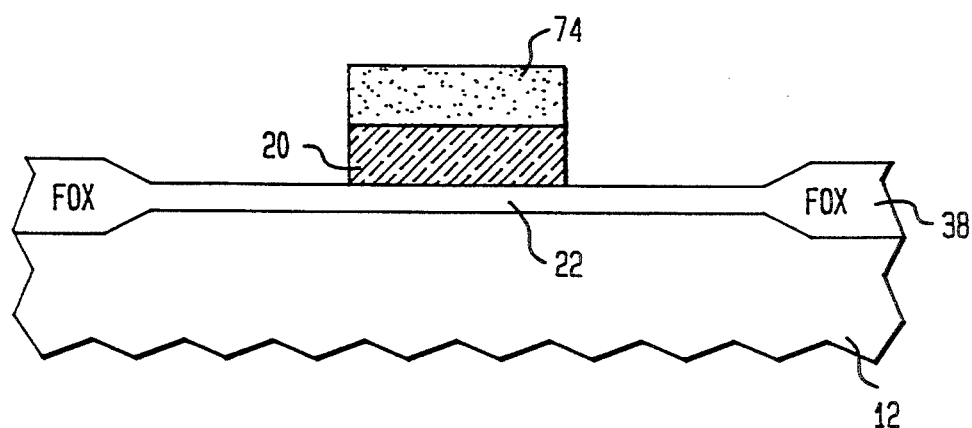

As shown in FIG. 4, the layers 70 and 72 are patterned, using for example, photolithography and etching, to form the polysilicon gate 20 which is covered by the oxide layer 74.

Figure 5:
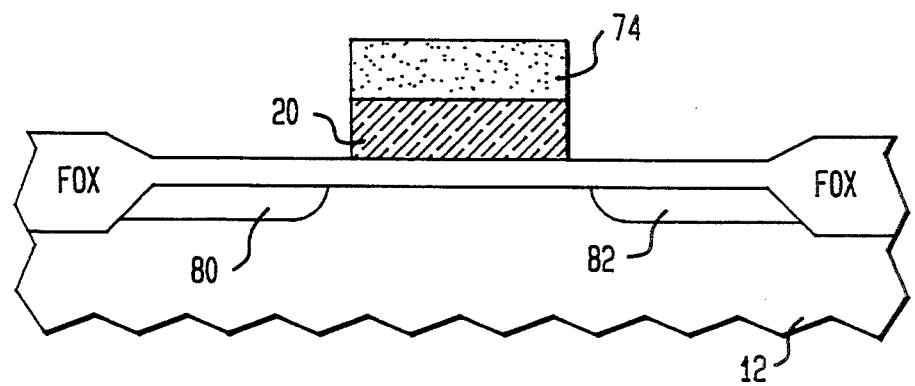

Next, as shown in FIG. 5, lightly doped source and drain regions 80 and 82 are formed on either side of the polysilicon (or polycide) gate 20. The lightly doped source and drain regions 80 and 82 have a depth of 0.15 μm and an N-type dopant concentration of $10^{17}$ cm$^{-3}$. Illustratively, the lightly doped source and drain regions are formed using ion implantation of phosphorous or arsenic atoms at a flux density of $10^{13}$ cm$^{-2}$ and an energy of 50 key.

Figure 6:
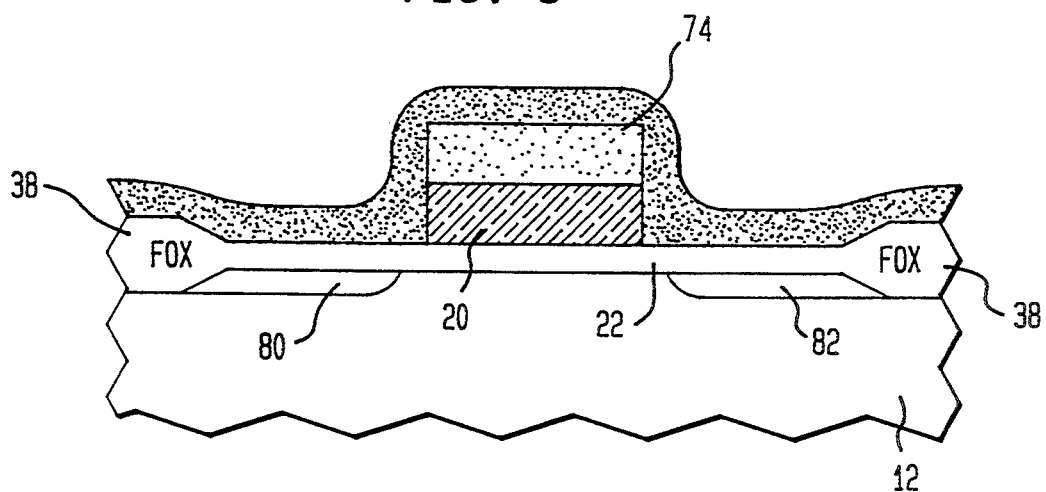
Figure 7:
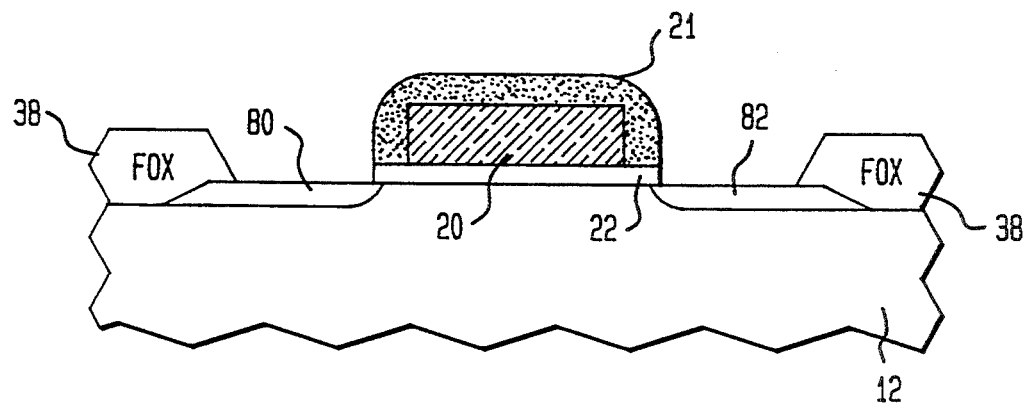

The next step is to enclose the gate 20 in a dielectric such as oxide. This is accomplished using the steps shown in FIG. 6 and FIG. 7. As shown in FIG. 6, an oxide layer 76 of thickness 2000 Å is deposited over the FOX region 38, gate oxide 22, and oxide 74. Then, the resulting structure is etched with an anisotropic oxide etching agent such as CF$_4$. The result is shown in FIG. 7. As shown in FIG. 7, the polysilicon gate is separated from the surface of the P-well 12 by gate oxide 22. The polysilicon gate 20 is also enclosed by the dielectric 21 which in the illustrative example is oxide (SiO$_2$). It should also be noted that the surface of the lightly doped source and drain regions 80 and 82 is exposed.

Figure 1:
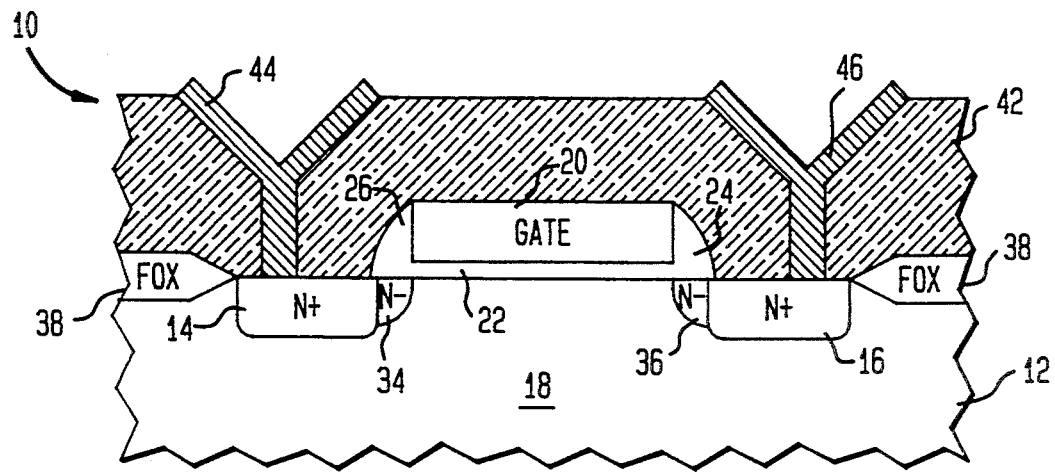
FIG. 1 illustrates a conventional MOS device.
Figure 2:
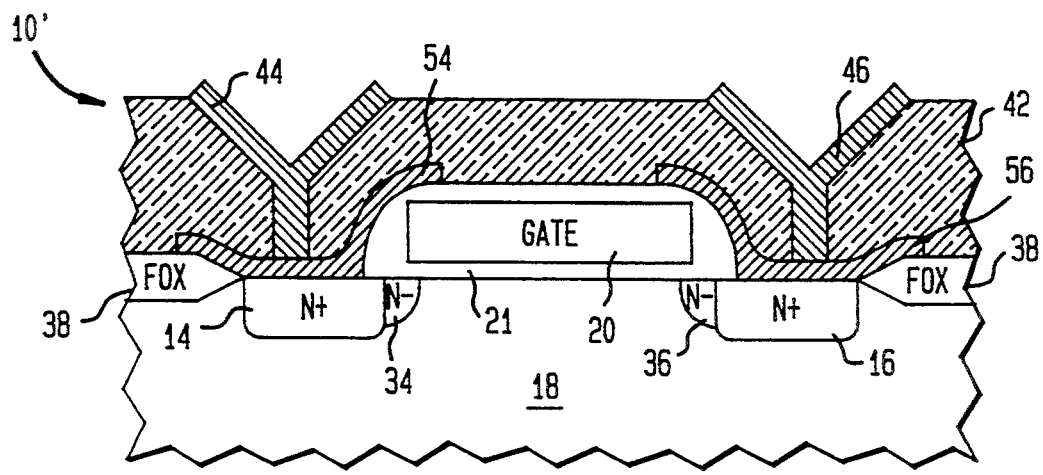
FIG. 2 illustrates a conventional MOS device made using a self-aligned contact process.

It should be noted the steps illustrated in FIGS. 3–7 are entirely conventional steps used in the formation of the conventional self-aligned contact MOS device such as that shown in FIG. 2.

The process steps wherein the present invention differs form the conventional self-aligned process are illustrated in FIGS. 8–12.

Figure 8:
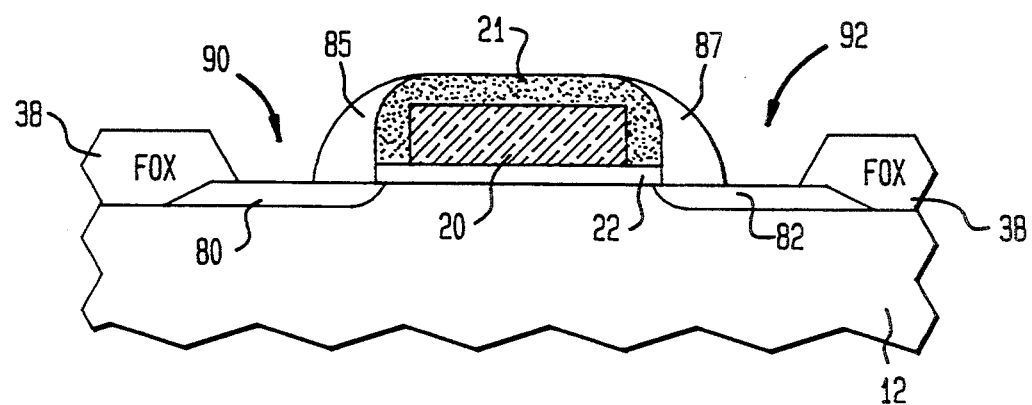

As shown in FIG. 8, the next step in the formation of an MOS device in accordance with an illustrative embodiment of the invention is the formation of nitride spacers 85 and 87. The nitride spacers 85 and 87 are located on either side of the enclosing dielectric 21. The nitride spacers are formed by depositing a nitride layer over the surface of the structure shown in FIG. 7 and anisotropically etching this layer using an etchant such as SF$_6$. It can be seen from FIG. 8 that a portion of the surface of the lightly doped source and drain regions 80 and 82 is covered by the dielectric 21. A further portion of the surface of the lightly doped source and drain regions is covered by the spacers 85 and 87. Moreover, as can be seen from FIG. 8, the portions 90 and 92 of the surface of the lightly doped source and drain region remain exposed.

Figure 9:
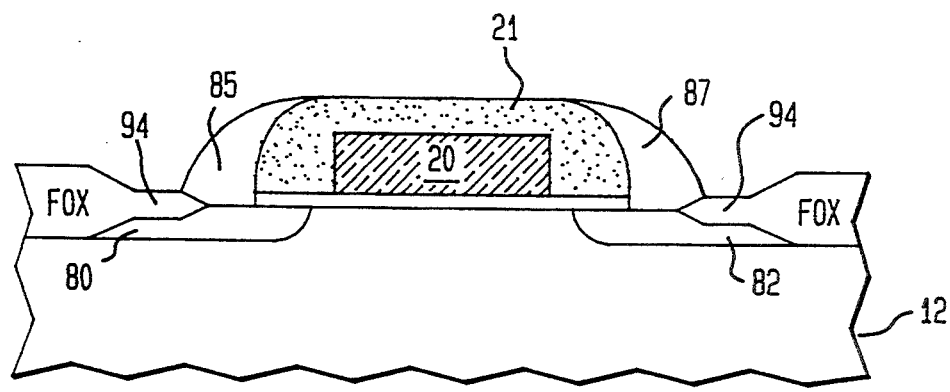

As shown in FIG. 9, the next step of the inventive process is to form a protective layer 94 over the exposed portions 90 and 92 of the lightly doped source and drain regions 80 and 82. Illustratively, the layer 94 is a dielectric such as oxide. This oxide layer may be thermally grown and has a thickness in the range of 500 Å.

Figure 10:
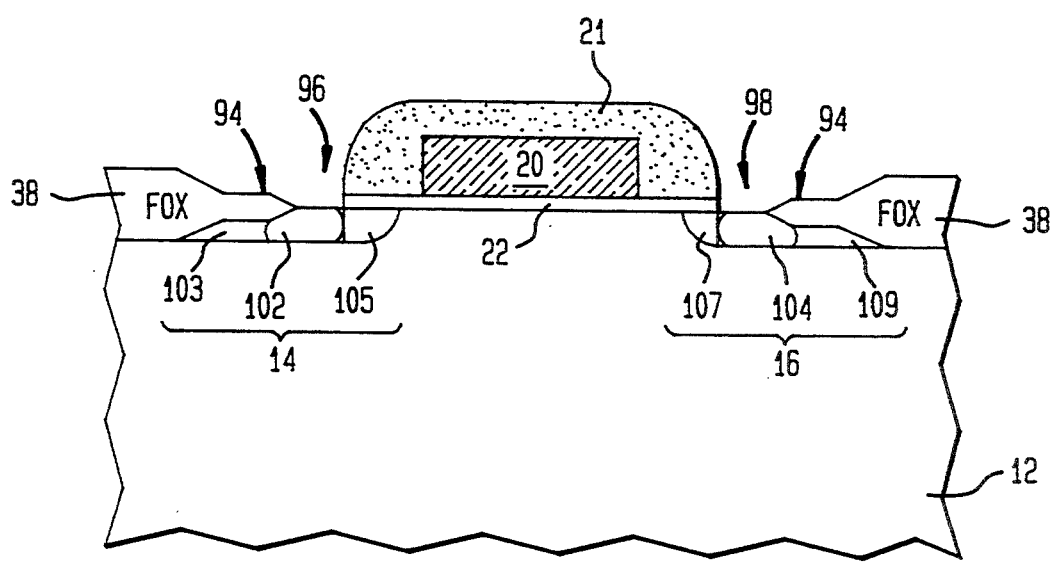

As shown in FIG. 10, the next step in the fabrication of the MOS device is the removal of the nitride spacers 85 and 87. This leaves openings 96 and 98 through which portions of the surface of the lightly doped source and drain regions are exposed. The width of the openings 96 and 98 is 0.15 μm. Using the openings 96 and 98, the heavily doped source and drain regions 102 and 104 are formed. Illustratively, the heavily doped source and drain regions are formed by ion implantation of N-type atoms such as arsenic or phosphorous using a flux density of $3 \times 10^{15}$ cm$^2$ with an energy of 30 Key. The depth of the resulting regions 102, 104 is 0.15 μm and the dopant concentration is $10^{20}$ cm$^{-3}$. The width of the heavily doped source and drain regions 102, 104 is determined by the width of the openings 96 and 98 and is about 0.15 μm.

Thus, the structure of FIG. 10 has a source 14 and a drain 16. The source 14 has three regions, a heavily doped region 102 and lightly doped regions 103 and 105 on either side of the heavily doped region 102. The lightly doped region 103 farthest from the gate 20 is covered by the dielectric layer 94. The lightly doped region 105 which is closest to the gate 20 is covered by the dielectric 21. The drain 16 also has three regions, a heavily doped region 104 and lightly doped regions 107 and 109 on either side of the lightly doped regions 104. The lightly doped region 109 which is furthest from the gate 20 is covered by the oxide layer 94 and the lightly doped region 107 which is closest to the gate 20 is covered by the dielectric 21.

It should be noted that for the source and drain 16, the size of the heavily doped region (102, 104) and the size of the lightly doped region (103,109) under the oxide layer 94 is not larger than the minimum source or drain region required in the conventional self-aligned contact process (see FIG. 2) to account for the worst possible case of gate to field oxide misalignment.

Figure 11:
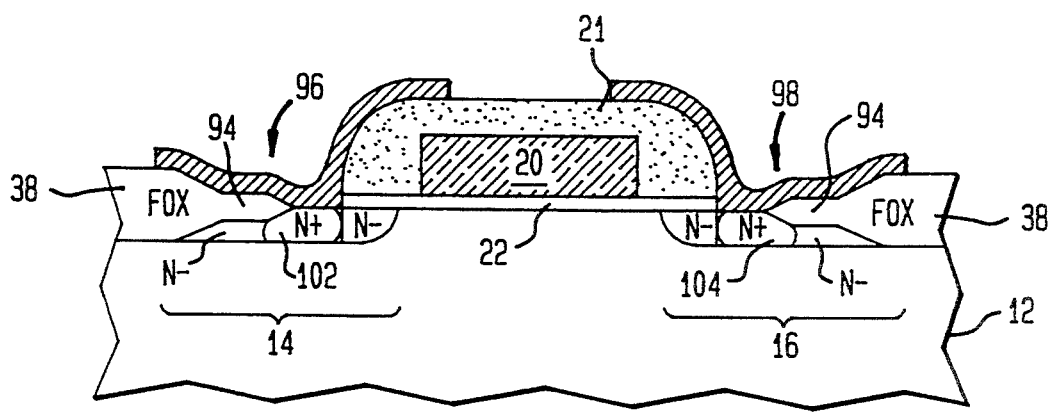

The next step is the formation of the self-aligned conducting interconnects 54 and 56. These interconnects are shown in FIG. 11. The conducting interconnects may be metal, polysilicon or polycide and have a thickness of 2000 Å. The conducting interconnects are formed by depositing a layer of conducting material and patterning this layer. The conducting interconnects contact the heavily doped source and drain regions 102 and 104 through the openings 96 and 98. The interconnects also are located in part over the dielectric 21 and FOX regions 38.

Figure 12:
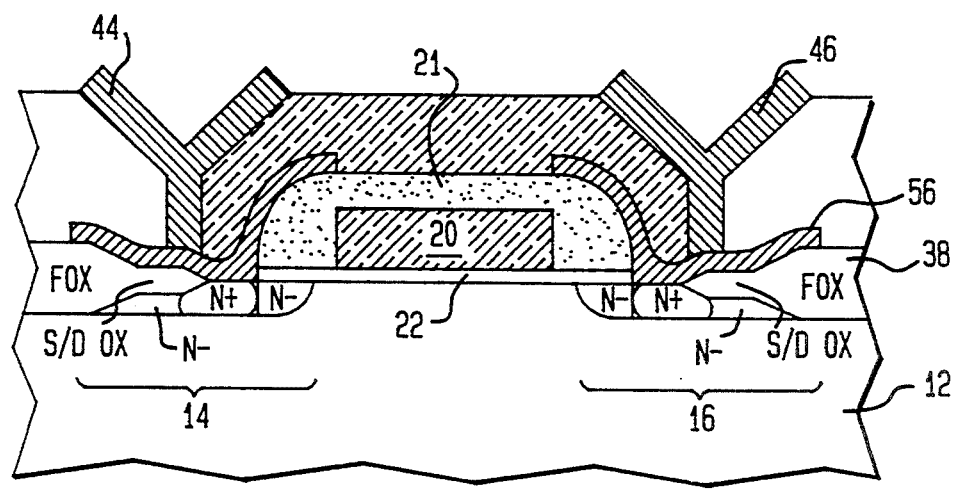

As shown in FIG. 12, to complete the fabrication of the device, the MPD layer 42 is deposited with a thickness of 5000 Å. This layer is then patterned to provide openings for the metal contacts 44 and 46. The metal contacts 44 and 46 are in electrical contact with the interconnects 54 and 56.

The advantage of the inventive fabrication technique and resulting device are significant. The size of the heavily doped source regions 102, 104 is determined by the size of the nitride spacers 85 and 87. Thus, the heavily doped regions 102 and 104 are of a small size (0.15 μm) and this size is easily reproducible in production. In addition, the resistance of the self-aligned interconnects 54 and 56 is well controlled and reproducible. Moreover, the total source/drain capacitance is reduced.

Finally, the above described embodiments of the invention are intended to be illustrative only. Numerous alternative embodiments and equivalent structures may be devised by those skilled in the art without departing from the scope of the following claims.

I claim:

1. A method for forming an MOS device comprising the steps of:
    (1) providing a substrate region having a gate enclosed in a dielectric formed thereon and lightly doped source and drain regions on either side of the gate,
    (2) forming spacers on opposite sides of the dielectric enclosed gate and over a portion of the lightly doped source and drain regions,
    (3) forming a protective layer over portions of said lightly doped source and drain regions not covered by said dielectric or said spacers so that the entire lightly doped source and drain regions are covered,
    (4) removing said spacers to form openings to expose a portion of said lightly doped source and drain regions,
    (5) implanting through said openings heavily doped source and drain regions,
    (6) forming interconnects to said heavily doped source and drain regions in said openings, and
    (7) forming metallic contacts to said interconnects.

2. The method of claim 1 wherein said substrate region is silicon, said enclosing dielectric is $SiO_2$ and said spacers are $Si_3N_4$.

3. The method of claim 2 wherein said protective layer is $SiO_2$.

* * * * *